United States Patent [19]
Butterweck et al.

[11] Patent Number: 4,569,030
[45] Date of Patent: Feb. 4, 1986

[54] RECURSIVE DIGITAL FILTER

[75] Inventors: Hans-Jürgen Butterweck, Geldrop; Adrianus C. P. van Meer, Eindhoven; Gérard Verkroost, Mierlo, all of Netherlands

[73] Assignee: U.S. Philips Corporation, New York, N.Y.

[21] Appl. No.: 445,347

[22] Filed: Nov. 29, 1982

[30] Foreign Application Priority Data

Dec. 23, 1981 [NL] Netherlands ............. 8105801

[51] Int. Cl.[4] ........................................ G06F 15/31
[52] U.S. Cl. ......................................... 364/724
[58] Field of Search ............... 364/572, 724, 825; 333/165-167

[56] References Cited

U.S. PATENT DOCUMENTS

| | | | |
|---|---|---|---|
| 3,997,770 | 12/1976 | Claasen et al. | 364/724 |
| 4,034,196 | 7/1977 | Butterweck et al. | 364/724 |
| 4,236,224 | 11/1980 | Chang | 364/724 |
| 4,361,893 | 11/1982 | Bonnerot | 364/724 |

OTHER PUBLICATIONS

Claasen et al, "Frequency Domain Criteria for the Absence of Zero-Input Limit Cycles in Nonlinear Discrete-Time Systems, with Applications to Digital Filters", *IEEE Trans. on Circuits and Systems*, vol. CAS-222, #3, pp. 232-239.

Claasen et al., "Second-Order Digital Filter with Only One Magnitude-Truncation Quantiser and Having Practically No Limit Cycles", *Electronics Letters*, vol. 9, Nov. 1st, 1973, #22, pp. 531-532.

Classen et al, "Effects of Quantization and Overflow in Recursive Digital Filters", *IEEE Trans. on Acoustics, Speech, and Signal Processing*, vol. ASSP-24, #6, Dec. 1976, pp. 517-529.

*Primary Examiner*—James D. Thomas
*Assistant Examiner*—Dale M. Shaw
*Attorney, Agent, or Firm*—Robert T. Mayer; Steven R. Biren

[57] ABSTRACT

A recursive digital filter includes a first circuit 1 including a cascade arrangement of a magnitude truncation quantizing arrangement and an adder 6, 8. The first circuit has an output 5, and also inputs 3 and 4, output 5 being connected to the input 3 via a second circuit 10 and to the input 4 via a third circuit 11. Both last-mentioned circuits are formed by a cascade arrangement of an auxiliary circuit 12 and 14, respectively, and a multiplier arrangement 13 and 15, respectively. The auxiliary circuit 12 has a transfer function $H_1(z)=p/(z-1)$ and the auxiliary circuit 14 has a transfer function $H_2(z)=q/(z+1)$, wherein p and q represent constants.

6 Claims, 5 Drawing Figures

RECURSIVE DIGITAL FILTER

BACKGROUND OF THE INVENTION

1. Field of the Invention

The invention relates to a recursive digital filter, the recursive portion of which includes:

a filter input;

a first circuit comprising a cascade arrangement of a quantizing device in the form of a magnitude truncator and adder means, the circuit having first, second and third inputs connected to the adder means, as well as an output coupled to one of the adder means, the first input being connected to the filter input;

a second and a third circuit for connecting the output of the first circuit to the second and third input, respectively of this first circuit and each being formed by a cascade arrangement of a multiplier arrangement and an auxiliary circuit.

The output signal of such a filter is obtained by forming a linear combination of the signals present in this recursive portion, for example the input signal and the two signals produced by the auxiliary circuits; or the input signal and the two signals produced by the multiplier arrangements.

2. Description of the Prior Art

As is known, a digital filter is an arrangement for filtering a digital input signal and producing a digital output signal.

A digital signal is a series of numbers. These numbers occur at fixed, equidistant instants. They are produced by a digital circuit or, for example, an analog-to-digital converter in which an analog signal is sampled. The distance between two successive instants at which a number occurs is sometimes referred to as the sampling period and this quantity will be designated by the symbol T. Each number comprises a plurality of bits. One bit usually indicates the polarity of the number and the other bits characterize the magnitude of this number. These last mentioned bits are therefore sometimes referred to as magnitude bits. A predetermined value or significance is assigned to each magnitude bit. The most significant magnitude bit usually has the value $(\frac{1}{2})^1$ and the least significant magnitude bit the value $(\frac{1}{2})^N$. Herein N represents the total number of magnitude bits of the number. Hereafter, as is common practice, this number of magnitude bits will be designated "word length".

Magnitude truncation is an operation performed on the magnitude bits of a number having a word-length $m+r$, whereby the r magnitude bits which are less significant than the least significant magnitude bit of the first m significant magnitude bits of that number are discarded, which results in a quantized number having a wordlength m.

Recursive digital filters of the type defined above and wherein only one quantizing arrangement is used in the recursive portion are described in the references 1-5 listed below. More particularly, each of the just two references describes a recursive digital filter in which the quantizing arrangement is in the form of a magnitude truncator.

As can be seen from these references, in these prior art recursive digital filters the first circuit is formed by first and second cascade-arranged adders, the first adder having its input connected to the filter input and its output to the output of the first circuit. The magnitude truncator is arranged either between the two adders or between the output of the first adder and the output of the first circuit. A typical prior-art filter is described in greater detail hereinafter.

The second circuit is formed by an auxiliary circuit in the form of a memory element whose output is connected to the input of a first constant-factor multiplier. The memory element, having a fixed storage time, and having its input connected to the output of the first circuit. The first constant-factor multiplier multiplies the signal applied thereto by a constant multiplication factor $a_1$ and has its output connected to an input of the second adder.

The third circuit is also formed by an auxiliary circuit in the form of a storage element, the output of which is connected to the input of a second constant-factor multiplier. The storage element in this third circuit has a storage time which is twice as long as the storage time of the storage element in the second circuit and the input thereof is connected to the output of the first circuit. The second constant-factor multiplier multiplying the signal applied thereto by a constant multiplication factor $a_2$ and having its output connected to the other input of the second adder.

In the second and third circuits a number stored in the associated storage element is multiplied by a constant factor $a_1$, $a_2$, respectively, Thus product numbers are produced each having a wordlength equal to the sum of the wordlengths of the numbers which were multiplied by each other. Two of these product numbers are added together in the second adder to form a sumnumber. This sumnumber is applied to the two storage elements and stored therein. The storage capacity of these storage elements must be adapted to the wordlength of these sumnumbers. The quantizing arrangement ensures that the storage capacity of the storage elements can be limited to a predetermined number of bits. To this end, as mentioned above, this quanitzing arrangement may be in the form of a magnitude truncator in which the wordlength of the sumnumber is limited by means of magnitude truncation. Alternatively, this quantizing arrangement may be of such a construction that the sum is rounded therein.

In all cases the quantizing arrangement performs a nonlinear operation on the sumnumbers. This results in that, in the recursive portion of the digital filter, all kinds of unwanted oscillator phenomema may occur which also affect the output signal of the filter, as this output signal is formed by a linear combination of signals present in this recursive portion.

Unwanted oscillation phenomena of this type are known as limit cycles. The specific form of such a limit cycle as regards its amplitude and period depend on the one hand on the operation performed in the quantizing arrangement and on the other hand on the nature of the input signal. A necessary condition for a limit cycle is that the input signal is either constant or periodic.

If in the quantizing arrangement magnitude truncation is effected in the manner described in Reference 1, then it appears that:

(a) if the input signal is constant and equal to zero, limit cycles having periods equal to once, twice or four times the sampling period T of the input signal will definitely not be generated, while furthermore the change of a limit cycle having another period being generated is very small.

(b) if the input signal is constant and unequal to zero, then many limit cycles may occur.

(c) if the input signal is periodical, then many limit cycles may be generated.

If in the quantizing arrangement controlled rounding is effected in the manner described in Reference 3, then it appears that:

(a) if the input signal is constant and equal to zero no limit cycles can occur.

(b) if the input signal is constant and unequal to zero, only limit cycles whose period is equal to once and/or twice the sampling period T can occur.

(c) if the input signal is periodical, having a period which is equal to twice the sampling period T, then limit cycles whose period is equal to once and/or twice the sampling period T can occur.

REFERENCES

1. Recursive digital filter: T.A.C.M. Claasen et al; U.S. Pat. No. 3,997,770, published Dec. 14, 1976. This patent specification is equivalent to the Netherlands Patent Application No. 7309534.
2. Second-Order Digital Filter with only One Magnitude-Truncation Quantiser and Having Practically No Limit Cycles; T.A.C.M. Claasen et al; Electronics Letters, Vol. 9, No. 22, Nov. 1, 1973, pages 531–532.
3. Digital Signal Processing Device; H. J. Butterweck et al; U.S. Pat. No. 4,034,196, published July 5th, 1977. This Patent Specification is equivalent to the Netherlands Patent Application No. 7414848.
4. Frequency Domain Criteria for the Absence of Zero-Input Limit Cycles in Nonlinear Discrete Time Systems, with Application to Digital Filters; T.A.C.M. Claasen et al; IEEE Transactions on Circuits and Systems, Vol. CAS-22, No. 3, March 1975, pages 232–239, FIG. 3 in particular.
5. Suppression of Parasitic Oscillations in Second-Order Digital Filters by Means of a Controlled-Rounding Arithmetic; H. J. Butterweck; A.E.U. Archiv fur Electronik und Uebertragungstechnik. Vol. 29 (1975), pages 371–374.
6. Effects of Quantization and Overflow in Recursive Digital Filters; T.A.C.M. Claasen et al; IEEE Transactions on Acoustics, Speech, and Signal Processing. Vol. ASSP-24, No. 6, December 1976, pages 517–529, FIG. 8 in particular.

SUMMARY OF THE INVENTION

The invention has for its object to provide a recursive digital filter of the type described above with which an output signal can be generated which is completely free from limit cycles irrespective of whether the input signal of the filter is constant, equal or unequal to zero, or periodical with a period which is equal to twice the sampling period T of the input signal.

According to the invention, the auxiliary circuit in the second circuit is of such construction that its transfer function $H_1(z)$ is defined by the expression $p/(z-1)$, wherein p represents a constant and the auxiliary circuit in the third circuit is of such a construction that its transfer function $H_2(z)$ is defined by the expression $q/(z+1)$, wherein q represents a constant.

DESCRIPTION OF THE PREFERRED EMBODIMENTS

A known 2nd order recursive digital filter

Figure 1:
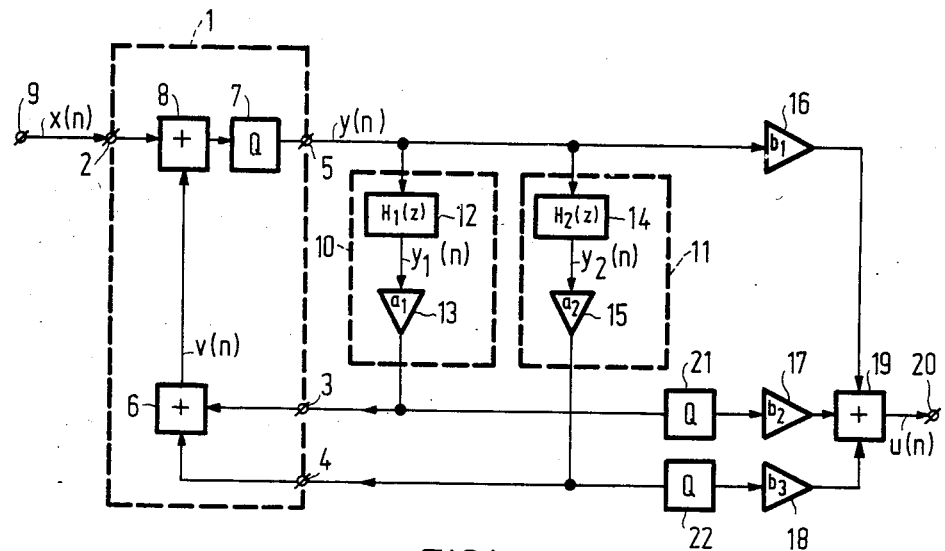
FIG. 1 shows an implementation of a second order recursive digital filter.

FIG. 1 shows the most usual implementation of a second order recursive digital filter. The recursive portion of this generally known filter comprises a first circuit 1 having a first input 2, a second input 3, a third input 4 and an output 5. More specifically, this first circuit 1 is formed by an adder 6 whose inputs are connected to the second input 3 and to the third input 4, respectively. At its output this adder produces a signal v(n) which is applied to an input of an adder 8. A further input of this adder 8 is connected to the input 2 of this first circuit and the output of this adder 8 is connected to the output 5 of the circuit via a quantizing arrangement in the form of a magnitude truncator circuit 7. A signal which will be denoted y(n) occurs at this output 5. The input 2 of this first circuit 1 is connected to the filter input 9 and thus receives the digital information signal x(n) to be filtered.

The output 5 of this first circuit is connected to its input 3 via a second circuit 10 and to its input 4 via a third circuit 11. In the embodiment shown this second circuit 10 is formed by a first auxiliary circuit 12 followed by a constant factor multiplier 13. Let it be assumed that this first auxiliary circuit 12 produces a signal $y_1(n)$ and has a transfer function $H_1(z)$ and that the multiplier 13 has the constant multiplying factor $a_1$. The third circuit 11 is formed by a second auxiliary circuit 14 followed by a constant factor multiplier 15. Let it be assumed that this second auxiliary circuit 14 produces a signal $y_2(n)$ and has a transfer function $H_2(z)$ and that the multiplying factor of the multiplier 15 is equal to $a_2$.

As has already been mentioned, the output signal of a recursive digital filter can be obtained by making a linear combination of the signals present in the recursive portion. To that end, in the embodiment shown, the output 5 of the first circuit 1 is connected via a constant-factor multiplier 16 to an input of an adder arrangement 19 whose output 20 also forms the output of the filter and at which the filter output signal u(n) occurs. Connected to further inputs of this adder arrangement 19 are the outputs of the constant-factor multipliers 13 and 15, more specifically via a cascade arrangement of a quantizing arrangement 21 and 22, respectively and a constant-factor multiplier 17 and 18, respectively. The constant-factor multipliers 16, 17 and 18 have the respective constant muliplying factors $b_1$, $b_2$ and $b_3$. The quantizing arrangements 21 and 22 are intended to limit the wordlengths of the product words produced by the multipliers 13 and 15.

As is disclosed in Reference 1, the auxiliary circuit 12 in the known second order recursive digital filter is in the form of a delay element having a time delay T of one sampling period, so that $H_1(z)=z^{-1}$. The auxiliary circuit 14 therein is formed by a delay element having a time delay 2T, so that $H_2(z)=z^{-2}$. That this prior art arrangement is substantially free from limit cycles if $x(n)=0$ for all $n \geq N_1$, can be demonstrated as follows. The magnitude truncator 7 produces each time a number y(n) whose absolute value is less than the absolute value of the sum $x(n)+v(n)$. In other words, this magnitude truncator 7 forces the signal y(n) to become zero, which, if $x(n)=0$ for $n \geq N_1$ will be successful in may cases after some sampling periods have elapsed. If from a predetermined value of n, for example $n=N_2 \geq N_1$ it holds that $y(N_2)=0$, then the two circuits 10 and 11 no longer receive an input signal, so that two sampling periods later both the circuit 10 and the circuit 11 no longer produce a signal which differs from zero. If now from a perdetermined value of n the input signal x(n) of the filter becomes unequal to zero again, then y(n) will become unequal to zero and no prediction can be made about the occurrence of limit cycles. In that case y(n) will be dependent of the amplitude of x(n).

Improvements to the recursive digital filter

From further experiments with recursive digital filters, it was found that if x(n) is constant and unequal to zero, or periodical having a period 2T, the occurrence of limit cycles in the signal y(n) and consequently in the filter output signal u(n) can be counteracted if it is ensured that the transfer function $F(z)=Y(z)/X(z)$ has a zero point for $z=-1$ and a zero point for $z=+1$. Herein Y(z) represents the z-transform of y(n) and X(z) represents the z-transform of x(n). If x(n) is constant (equal or unequal to zero), or periodical having a period 2T, and F(z) satisfies this condition, then after some sampling periods the signal y(n) will assume the value zero, and the auxiliary circuits 12 and 14 no longer receive a signal which differs from zero and consequently will not produce a signal differing from zero. Put differently, y(n) is free from limit cycles.

It has been found that the above-mentioned transfer function F(z) can be obtained in a particularly simple manner; namely by means of the following choice of the transfer functions of the auxiliary circuits.

$$H_1(z)=p/z-1$$

$$H_2(z)=q/z+1$$

Herein p and q represent constants. More particularly, it preferably holds that $p=+1$ and $q=-1$. For the transfer function F(z) it now holds that:

$$F(z) = \frac{Y(z)}{X(z)} = \frac{(z-1)(z+1)}{z^2 + (-a_1p - a_2q)z - a_1p + a_2q - 1}$$

Figure 2:
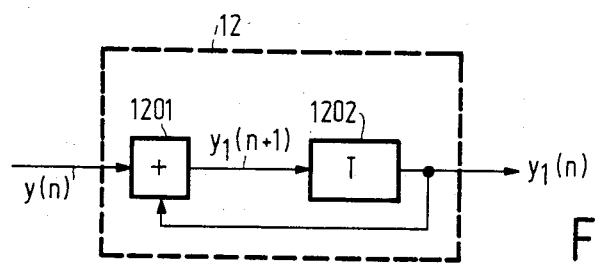
FIG. 2, FIG. 3, FIG. 4 and FIG. 5 show embodiments of auxiliary circuits, suitable for use in the filter shown in FIG. 1.

FIG. 2 shows an embodiment of the auxiliary circuit 12 for the case $p=+1$. This auxiliary circuit 12 constitutes an accumulator including an adder 1201 followed by a delay element 1202. The signal y(n), and also the signal $y_1(n)$ produced by the delay element 1202 and representing the output signal of this first auxiliary circuit 12, are applied to adder 1201. This adder produces the signal $y_1(n+1)=y(n)+y_1(n)$. The delay element 1202 has a time delay T equal to one sampling period, so that the transfer function of this auxiliary circuit is equal to $Y_1(z)/Y(z)=1/(z-1)$.

Figure 3:
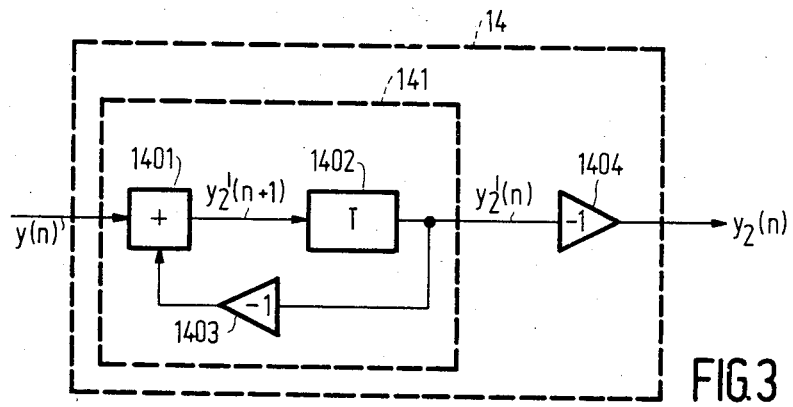

FIG. 3 shows an embodiment of the second auxiliary circuit 14 for the case $q=-1$. This second auxiliary circuit 14 comprises an alternator 141 formed by an adder 1401 followed by a delay element 1402 which produces the signal $y_2'(n)$. The signal y(n), and also the signal $y_2'(n)$ which is multiplied in a constant-factor multiplier 1403 by a factor $-1$ are applied to the adder 1401 and this adder 1401 consequently produces the signal $y_2'(n+1)$. As the time delay of the delay element 1402 is equal to T, the transfer function of this alternator 141 is equal to $1/(z+1)$. To obtain the desired transfer function $-1/(z+1)$, the signal $y_2'(n)$ is multiplied by a factor $-1$ in a constant-factor multiplier 1404, which results in the signal $y_2(n)$.

Figure 4:
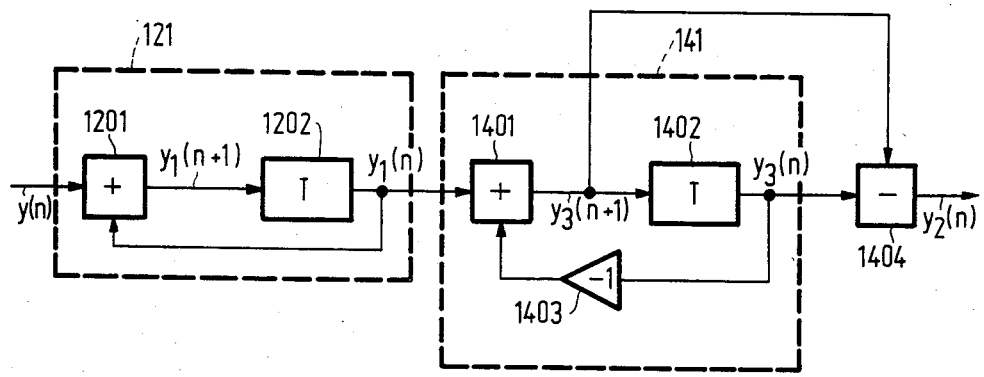

FIG. 4 shows another embodiment of the auxiliary circuit 14. As can be seen from a comparison between the FIGS. 2, 3 and 4, this second auxiliary circuit shown in FIG. 4 comprises a cascade arrangement of an accumulator 121 and an alternator 141, the accumulator 121 being in all respects identical to the accumulator 12 of FIG. 2 and the alternator 141 being identical in all respects to the alternator 141 shown in FIG. 3. However, in this embodiment the alternator 141 produces the signal $y_3(n)$ in response to the input signal $y_1(n)$. In order to obtain the desired output signal $y_2(n)$, the signals $y_3(n)$ and $y_3(n+1)$ are subtracted from each other in a subtracting arrangement 1404 so that $y_2(n)=y_3(n)-y_3(n+1)$. This second auxiliary circuit 14 shown in FIG. 4 has the transfer function:

$$Y_2(z)/Y(z)=-1/(z+1)$$

Figure 5:
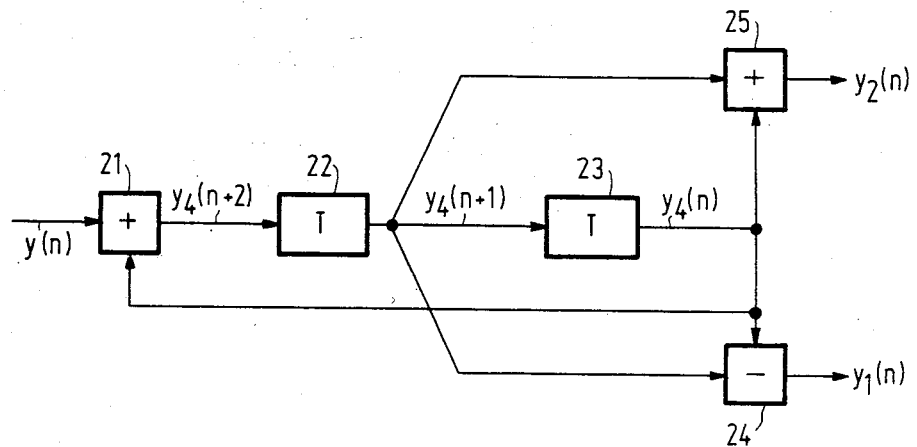

Since the circuit 121 produces the signal $y_1(n)$ and has the transfer function $H_1(z)=1/(z-1)$, this signal $y_1(n)$ may alternatively be applied to the multiplier 13. From this it follows that the auxiliary circuits 12 and 14 need not be present as physically independent units. These auxiliary circuits may be of such a construction that they have certain elements in common. A multi-functional auxiliary circuit based on this idea is shown in FIG. 5. It produces the signal $y_1(n)$ and also the signal $y_2(n)$. More particularly, this multi-functional auxiliary circuit is formed by an adder 21 followed by a cascade arrangement of delay elements 22 and 23, each having a time delay T. The delay element 23 produces the signal $y_4(n)$ and the delay element 22 produces the signal $y_4(n+1)$. The signals $y_2(n)$ and y(n) are added together in the adder 21, which results in the signal $y_4(n+2)$ which is equal to $y(n)+y_4(n)$. The signal $y_1(n)$ is now obtained by forming the difference between the signals $y_4(n)$ and $y_4(n+1)$, so that $y_1(n)=y_4(n)-y_4(n+1)$. The signal $y_2(n)$ is obtained by summing the signals $y_4(n)$ and $y_4(n+1)$, so that $y_2(n)=y_4(n)+y_4(n+1)$.

Several alternate arrangements are possible without departing from the spirit and scope of the invention. For example:

1. The magnitude truncator which in the embodiment of FIG. 1 is arranged between the output of adder 8 and the output 5 of the first circuit 1 may alternatively be arranged between the two adders 6 and 8.

2. In the embodiment shown in FIG. 1, the multiplier 13 and 15, respectively in each of the circuits 10 and 11 is connected to the output of the associated auxiliary circuit 12 and 14, respectively. However this sequence may be inverted.

3. The embodiments of the auxiliary circuits 12 and 14 shown in the FIGS. 2, 3, 4 and 5 each comprise individually a recursive digital filter which is more specifically in the form of an accumulator or an alternator. In each of these recursive digital filters a limit cycle may however occur if $y(n)=0$. If despite this cycle, which is commonly referred to as "internal limit cycle", it continues to hold that $y(n)=0$, then this means that its amplitude is so small that it cannot pass the quantizing arrangement 7. If now the quantizing arrangements 21 and 22 are constructed in a similar manner as the quantizing arrangement 7 the such an internal limit cycle can also not pass through these two quantizing arrangements 21 and 22, so that the output signal u(n) remains free from limit cycles.

4. When the suppression of the said "internal limit cycles" is also desired, this digital filter should be provided with a first and a second limit cycle detector, which is just a level detector having two inputs and an output. The first limit cycle detector produces an output signal when both the output signal y(n) of quantizer arrangement 7 and the output signal of quantizer arrangement 21 are zero. The output signal of this first limit cycle detector is used for resetting the delay element(s) included in the first auxiliary circuit 12. The second limit cycle detector produces an output signal when both the output signal y(n) of quantizer arrangement 7 and the output signal of quantizer arrangement 22 are zero. The output signal of this second limit cycle detector is used for resetting the delay element(s) included in the second auxiliary circuit 14.

What is claimed is:

1. A recursive digital filter, the recursive portion of which comprises:
   a filter input;
   a first circuit including a cascade arrangement of a magnitude truncation quantizing device and adder means, the circuit having first, second and third inputs connected to the adder means, as well as an output coupled to the adder means, the first input being connected to the filter input;
   a second and a third circuit for connecting the output of the first circuit to the second and the third input, respectively, of the first circuit and each of the second and third circuits including a cascade arrangement of an auxiliary circuit and a multiplier arrangement; and
characterized in that the auxiliary circuit in the second circuit has a transfer function $H_1(z)$ which is defined by the expression $H_1(z)=p/(z-1)$, wherein p represents a constant equal to $+1$, and that the auxiliary circuit in the third circuit has a transfer function $H_2(z)$ which is defined by the expression $H_2(z)=q/(z+1)$, wherein q represents a constant equal to $-1$.

2. A recursive digital filter as claimed in claim 1, characterized in that the auxiliary circuit in the second circuit is formed by an accumulator.

3. A recursive digital filter as claimed in claim 1, characterized in that the auxiliary circuit in the third circuit comprises an alternator.

4. A recursive digital filter as claimed in claim 1, characterized in that the two auxiliary circuits are interwoven to form a multi-functional auxiliary circuit.

5. A recursive digital filter as claimed in claim 1, characterized in that the multi-functional auxiliary circuit comprises a cascade arrangement of an accumulator and an alternator.

6. A recursive digital filter as claimed in claim 1 characterized in that the multi-functional auxiliary circuit is formed by a first adder having two inputs, as well as an output connected to a cascade arrangement of two delay elements, the output of the last delay element being connected to one of the inputs of the first adder and also to an input of a second adder and to an output of a subtracting arrangement, a second input of this second adder and of this subtracting arrangement being connected to the input of said last delay element, the output of the second adder being connected to the multiplier arrangement in the third circuit and the output of the subtracting arrangement being connected to the multiplier arrangement in the second circuit.

* * * * *

UNITED STATES PATENT AND TRADEMARK OFFICE
CERTIFICATE OF CORRECTION

PATENT NO. : 4,569,030

DATED : February 4, 1986

INVENTOR(S) : HANS-JURGEN BUTTERWECK ET AL

It is certified that error appears in the above-identified patent and that said Letters Patent is hereby corrected as shown below:

IN THE CLAIMS:

Claim 5, line 1, after "1" insert --or 4--.

Claim 6, line 1, after "1" insert --or 4--.

Signed and Sealed this

Sixteenth Day of December, 1986

Attest:

DONALD J. QUIGG

Attesting Officer          Commissioner of Patents and Trademarks